United States Patent
Carden et al.

(10) Patent No.: US 6,552,266 B2
(45) Date of Patent: Apr. 22, 2003

(54) HIGH PERFORMANCE CHIP PACKAGING AND METHOD

(75) Inventors: Timothy F. Carden, Vestal, NY (US); Glenn O. Dearing, Endicott, NY (US); Kishor V. Desai, Fremont, CA (US); Stephen R. Engle, Binghamton, NY (US); Randall Stutzman, Vestal, NY (US); George H. Thiel, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/770,913

(22) Filed: Jan. 26, 2001

(65) Prior Publication Data

US 2001/0009196 A1 Jul. 26, 2001

Related U.S. Application Data

(62) Division of application No. 09/041,580, filed on Mar. 11, 1998.

(51) Int. Cl.[7] .............................................. H01L 23/02
(52) U.S. Cl. ....................... 174/52.4; 257/713; 257/738; 257/706
(58) Field of Search ................ 174/52.2, 52.4; 257/707, 712, 713, 717, 738; 361/718

(56) References Cited

U.S. PATENT DOCUMENTS

| | | | |
|---|---|---|---|
| 4,288,841 A | 9/1981 | Gogal | 361/792 |
| 4,408,218 A | 10/1983 | Grabbe | 257/670 |
| 4,477,827 A | 10/1984 | Walker et al. | 257/670 |
| 4,545,761 A | 10/1985 | Cartwright et al. | 432/5 |
| 4,582,245 A | 4/1986 | Cartwright | 228/180.21 |
| 4,600,968 A | 7/1986 | Sekiya et al. | 361/730 |
| 4,630,172 A | 12/1986 | Stenerson et al. | 361/718 |
| 4,638,348 A | 1/1987 | Brown et al. | 257/700 |
| 4,658,331 A | 4/1987 | Berg | 361/705 |
| 4,681,654 A | 7/1987 | Clementi et al. | 216/18 |
| 4,860,165 A | 8/1989 | Cassinelli | 361/71 |
| 4,873,615 A | 10/1989 | Grabbe | 361/742 |
| 5,198,887 A | 3/1993 | Brown | 361/717 |
| 5,281,151 A | 1/1994 | Arima et al. | 439/68 |
| 5,289,337 A * | 2/1994 | Aghazadeh et al. | 361/718 |
| 5,297,006 A | 3/1994 | Mizukoshi | 361/704 |
| 5,382,827 A | 1/1995 | Wang et al. | 257/528 |
| 5,388,029 A | 2/1995 | Moriyama | 361/760 |
| 5,390,079 A | 2/1995 | Aomori et al. | 250/551 |
| 5,404,273 A | 4/1995 | Akagawa | 361/707 |
| 5,539,151 A * | 7/1996 | Hamzehdoost et al. | 174/52.4 |
| 5,557,500 A | 9/1996 | Baucom et al. | 361/687 |
| 5,574,386 A | 11/1996 | Beaumont et al. | 324/765 |
| 5,886,408 A | 3/1999 | Ohki et al. | 257/720 |
| 5,909,056 A * | 6/1999 | Mertol | 257/704 |
| 5,949,137 A * | 9/1999 | Domadia et al. | 257/712 |
| 6,259,154 B1 * | 7/2001 | Niwa | 257/678 |
| 2001/0033017 A1 * | 10/2001 | Wang et al. | 257/698 |

OTHER PUBLICATIONS

Mullady, R. K. "Stackable 'J' Leaded Chip Carrier", IBM Technical Disclosure Bulletin, vol. 28, No. 12, May 1986.
Robock, P.V. "Stackable Plastic Semiconductor Chip Carrier", IBM Technical Disclosure Bulletin, vol. 27, No. 4B, Sep. 1984.

* cited by examiner

Primary Examiner—Hung V. Ngo
(74) Attorney, Agent, or Firm—Schmeiser, Olsen & Watts; Lawrence R. Fraley

(57) ABSTRACT

A chip carrier package that includes a cover plate attached to the stiffener by a reflowable bonding material is disclosed. Additionally, a thermally and electrically conductive bonding material between the cover plate and the chip itself may be included. Also a chip package including an alignment device to aid in properly aligning the cover plate on the stiffener. Furthermore, a method of packaging a chip including providing a reflowable material between the cover plate and stiffener body for attaching the cover plate to the stiffener, and simultaneously attaching the cover plate to the stiffener with an attaching of the carrier to an electronic circuit board.

12 Claims, 4 Drawing Sheets

HIGH PERFORMANCE CHIP PACKAGING AND METHOD

This application is a divisional of Ser. No. 09/041,580, filed on Mar. 11, 1998.

BACKGROUND OF THE INVENTION

1. Technical Field

The present invention relates generally to semiconductor chip packaging and carriers. More particularly, the present invention relates to a chip packaging with a cover plate that is held onto a stiffener by an interposed bonding material. The present invention also includes an alignment device for the cover plate and a method of packaging a chip.

2. Related Art

Heretofore, adhesives or mechanical structures have been used to attach cover plates to stiffeners on chip packaging. The use of adhesives create a number of problems. For instance, the use of adhesives provides poor tolerances because of uneven layering because of a failure of the adhesives to evenly or uniformly coat surfaces of a cover plate and stiffener. Precise tolerances are required because the pressures created by the adhesives being unevenly layered creates pressures on the chip, stiffener and cover plate that can create cracking. Further potential for cracking is developed by the need to repeatedly heat the package. For example, heating is required to connect the chip to the carrier, then again for connecting the stiffener and cover plate, and then again to connect the carrier to other circuitry like a printed circuit board. Poor tolerances also can create large gaps between the cover plate and stiffener resulting in poor thermal performance. To address the above problems, cover plates and stiffeners must be very accurately sized. However, this requirement adds complexity to the manufacturing process, i.e., the need to accurately form the parts and exactly locate them for joining. The need to compensate for poor tolerances also necessitates the addition of material and, hence, weight to the cover plate and the overall package.

The use of mechanical connectors encounters similar problems as to those outlined above. Another disadvantage is that mechanical connectors add more undesirable weight to the package.

For the above reasons, there is a need in the art to have a chip package, and process of manufacture therefor, where a cover plate that is more accurately attached to a stiffener to achieve lower weight and reduced potential for die crack initiation. Further, there is, as always, a need to increase thermal performance.

SUMMARY OF THE INVENTION

In a general aspect in accordance with the present invention is provided a chip package having a chip carrier, a stiffener attached to the carrier, and a cover plate attached to the stiffener by a reflowable bonding material. The bonding material is preferably a solder material. This aspect provides a number of advantages. For instance, the need to precisely size parts is greatly reduced in that the cover plate is attached to the stiffener in such a way that it self-centers itself within the stiffener when the reflowable bonding material is heated. As a result, the potential for chip cracking is reduced. Further, because the cover plate need not be so precisely sized, lower weight can be obtained for the cover plate and the overall package. There is also an increase in thermal performance not exhibited in the related art devices because of the better cover plate to stiffener connection.

The above described aspect may also advantageously include an interface material attaching the cover plate and the chip itself. This further aids in thermal conductivity and allows for setting the cover plate at an advantageous predetermined electrical potential, e.g., ground, if the interface material is electrically conductive.

In a second general aspect in accordance with the present invention is provided a chip carrier including: a stiffener, a cover plate to cover the stiffener, and an alignment device to aid in properly aligning the cover plate on the stiffener. This aspect aids in properly aligning the cover plate on the stiffener to prevent die (or chip) cracking and assure even dispersion of the bonding material.

In a third general aspect in accordance with the present invention is provided a method of packaging a chip, the packaging having a carrier, a stiffener having an opening in which the chip is positioned on the carrier, and a cover plate to cover the opening, the method comprising the steps of: providing a reflowable material between the cover plate and stiffener for attaching the cover plate to the stiffener, and attaching the cover plate to the stiffener simultaneously with an attaching of the carrier to other circuitry. This aspect provides a process of manufacturing a chip package with fewer heating cycles and, thus, the potential for reduced die (or chip) crack initiation in the package.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment.

Figure 1:
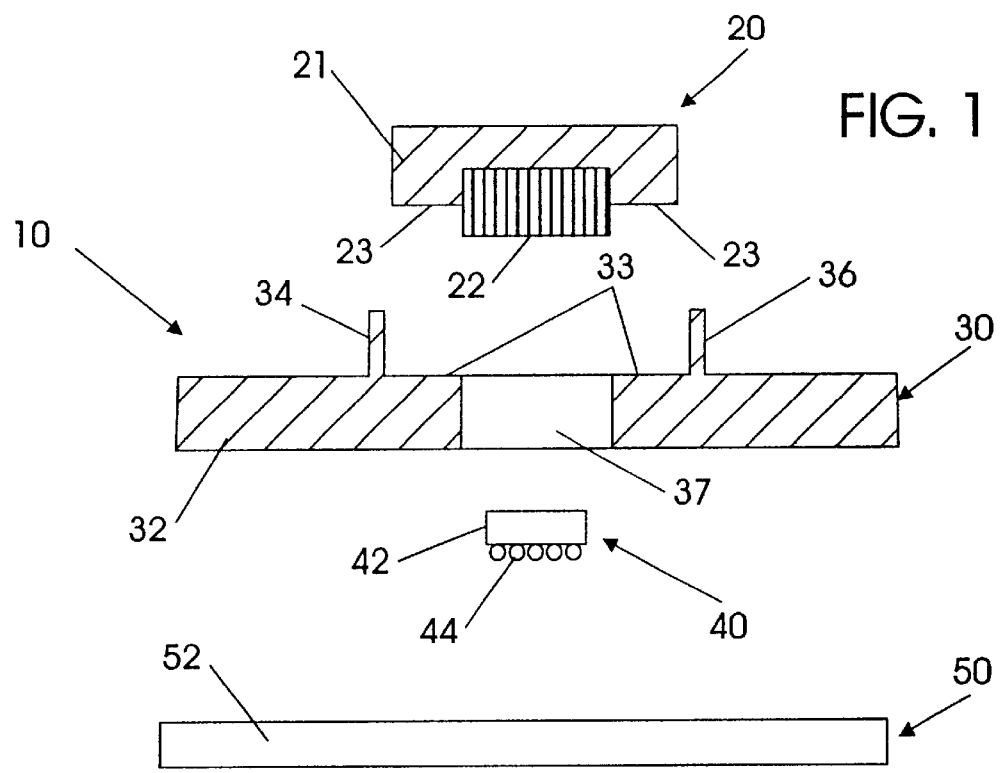
FIG. 1 shows an exploded cross-sectional side view of a chip package in accordance with a first embodiment of the present invention.

Referring to the drawings, FIG. 1 shows an exploded cross-sectional side view of a chip package in accordance with a first embodiment of the present invention. The chip package 10 generally includes a cover plate 20, a stiffener 30, a chip 40 and a carrier 50. The stiffener 30 includes a base section 32 with a chip opening 37 provided therein. The opening 37 is provided to house a chip 40. The base section 32 may also include risers 34, 36 that aid in generally positioning the cover plate 20 within the opening 37, the advantages of which will be discussed below. The stiffener 30 is attached to a carrier 50, in the form of a plate 52, and acts to rigidify the plate 52. The chip 40 generally includes a circuitry portion 42 and a plurality of connectors 44, e.g., bumping or controlled collapse chip connecting (C4), extending therefrom for connection to the carrier 52. The carrier 52 may also include circuitry (not shown) along a surface thereof to which the chip 40 is connected and a ball grid array 54 (BGA) for connection to other circuitry on a substrate 80, e.g., an electronic circuit board.

The cover plate 20 is constructed to have a base portion 21 and may also include a raised area or pedestal 22. The stiffener 30 and cover plate 20 are made of metals, e.g., copper, stainless steel, aluminum, etc. or alloys thereof. The base portion 21 of the cover plate is sized to cover the opening 37 so as to close the opening 37. If the pedestal 22 is used, the pedestal 22 is sized to fit into the opening 37 to further close off the opening. However, it is important to note that the cover plate 20, as shown in FIG. 2B, need not include the raised area 22. Further, the cover plate may be altered in size as necessary. For instance, the cover plate 20 may cover not only the opening 37 but also the entire stiffener 30, as shown in FIG. 2B. In this instance, the cover plate 20 may require alteration from that of FIG. 1. In particular, the cover plate 20 may require openings or grooves 23 to accommodate the shape of the risers 34, 36, the benefits of which will be discussed infra.

Figure 2A:
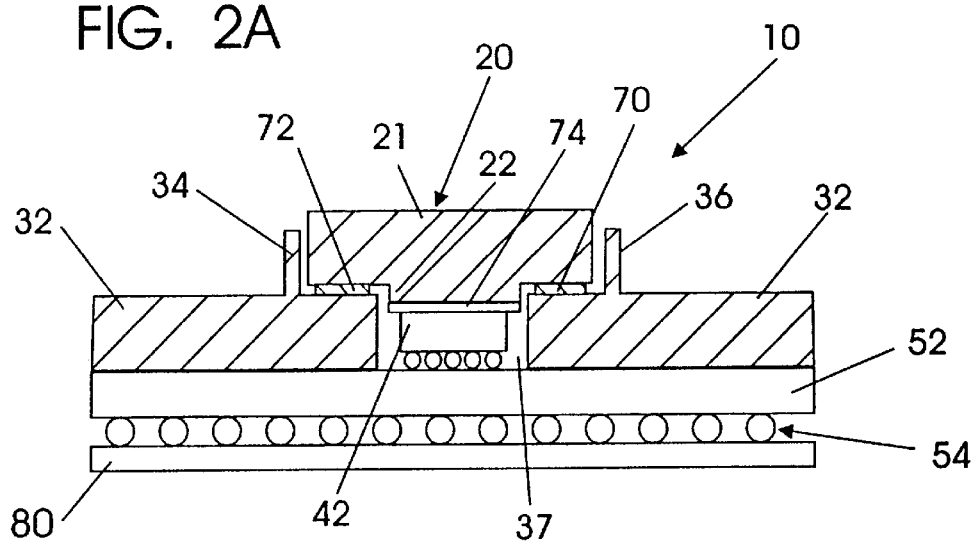
FIG. 2A shows a cross-sectional side view of a chip package in accordance with the first embodiment of the present invention.
Figure 2B:
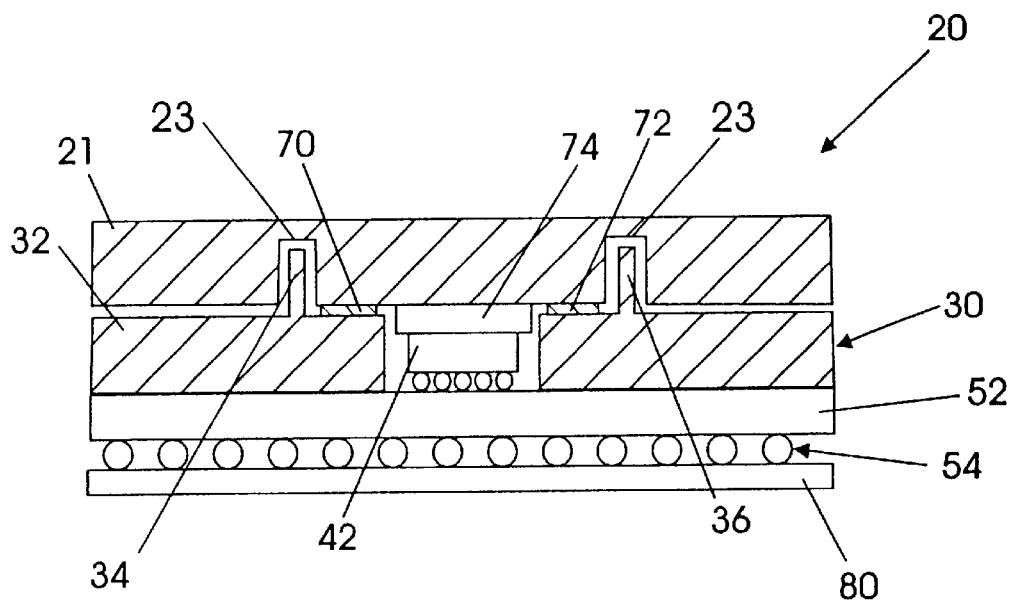
FIG. 2B shows a cross-sectional side view of a chip package with an enlarged cover plate in accordance with the first embodiment of the present invention.

In accordance with the present invention, and as shown in FIGS. 2A and 2B, the cover plate 20 is attached to the stiffener 30 by a thermally conductive bonding or reflowable material 70, 72. The bonding material 70, 72 may take a variety of forms but must be able to bond the cover plate 20 to the stiffener 30 so as to provide good thermal conductivity therebetween. For instance, an adhesive or low melt solder may be used, with solder materials being most preferable. Another possibility is low melt solder paste which has been screened on to one of the components. In terms of more particular substances, an adhesive that has been used is a silicone-based material manufactured by General Electric, Co. and sold as GE 3281®. In terms of low melt solder or low melt solder paste, tin lead based materials have been used. The general feature of the low melt solder is that it be highly thermally conductive and readily flowable (reflowable) when heated so as to uniformly coat the surfaces between the stiffener 30 and cover plate 20 when heated. General features of other materials, such as GE 3281®, are thermally conductive and conformable when assembled.

The reflowable bonding material 70, 72 may be initially located along the un-raised portion 23 of the cover plate, if a raised area 22 is provided, or along an edge 33 of the opening 37. However, in order to attach the cover plate 20 to the stiffener 30, the material 70, 72 must be heated to melt or cure the reflowable bonding material. This step is completed after the heating step to connect the chip 40 to the carrier 52, and during or before connecting the carrier 52 to other circuitry, e.g., to a substrate 80 of, for example, an electronic circuit board. The chip 40 is connected to the carrier 52 by the plurality of connectors 44. The temperature for the process is preferably in the range of 180 to 240 degrees Centigrade.

A further advantage of the present invention is that as the reflowable bonding material 70, 72 melts and flows it allows the cover plate 20 to self-center within the opening 37. As a result, the bonding material 70, 72 is more evenly layered around the cover plate and, hence, pressures which can create cracking in the chip 40 are reduced.

As an alternative, the cover plate 20, and in particular the raised area 22 if provided, may also be attached to the top of the chip 40 by an interface material 74. This allows for more heat conductivity away from the chip 40 and enhanced thermal performance overall. Further, if connection of the cover plate 20 to the chip 40 is chosen, the interface material 74, and if desired reflowable bonding materials 70, 72, may also be electrically conductive. The provision of electrically conductive material 74 (and, if desired, material 70, 72) allows the cover plate to be set to an advantageous predetermined electrical potential with regard to the chip 40. For instance, the cover plate may be grounded thus providing an additional safeguard for the chip 40 from such things as static shock. In terms of the type of interface material used, the material may take a variety of forms. For instance, the interface material 74 may be low melt solder paste, an adhesive such as the silicone-based material discussed above, and thermal grease, e.g., zinc oxide based material. If the interface material is to be electrically conductive, then low melt solder paste, such as a tin lead based material has been found to be preferable.

Figure 3:
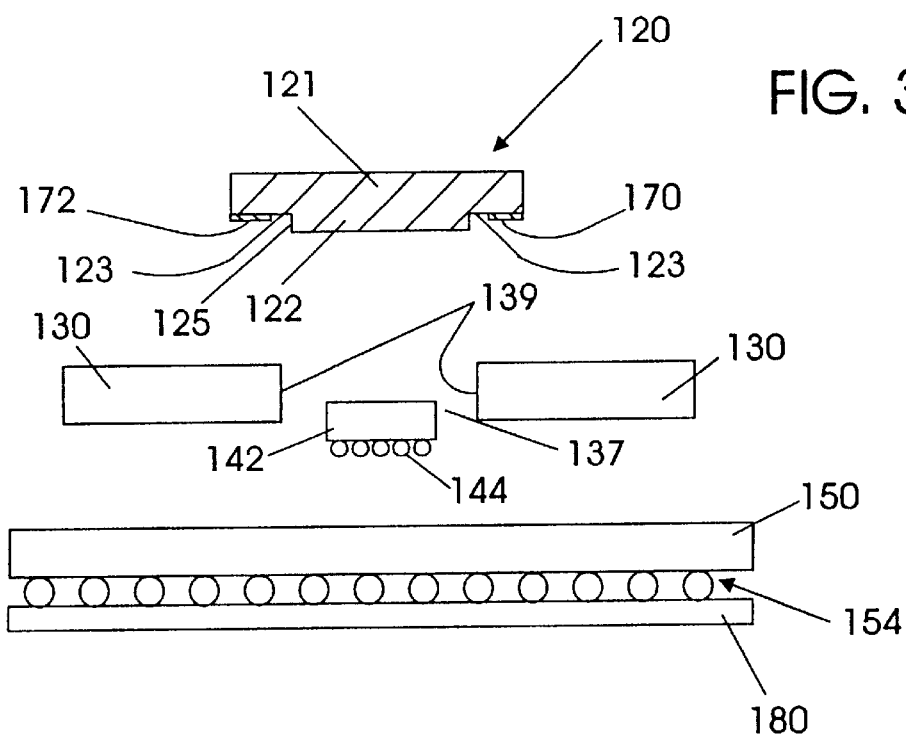
FIG. 3. shows an exploded cross-sectional side view of a chip package in accordance with a second embodiment of the present invention.
Figure 4:
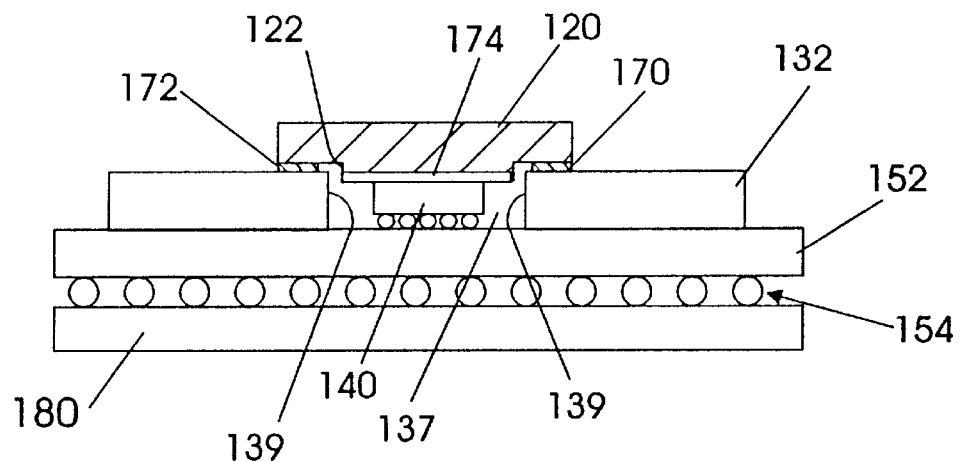
FIG. 4 shows a cross-sectional side view of a chip package in accordance with the second embodiment of the present invention.

Referring to FIGS. 3 and 4, a second embodiment of the present invention in which the risers 34, 36 are removed. In this embodiment, when the materials 170, 172 and 174 are heated to melt, the cover plate 120 more freely self-centers in the opening 137. As a result, the raised area 122 is centered within opening 137 such that an even layer of material exists between an inside portion 125 of the raised area 122 and an inner edge 139 of the opening 137. It is important to note as with the first embodiment, that the particular size of the cover plate 120 may be altered to cover more or less of the stiffener 130 as necessary.

Figure 5:
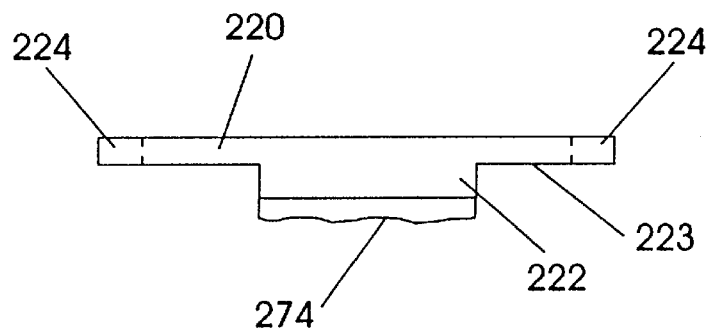
FIG. 5 shows a side view of a cover plate in accordance with a third embodiment of the present invention.
Figure 6:
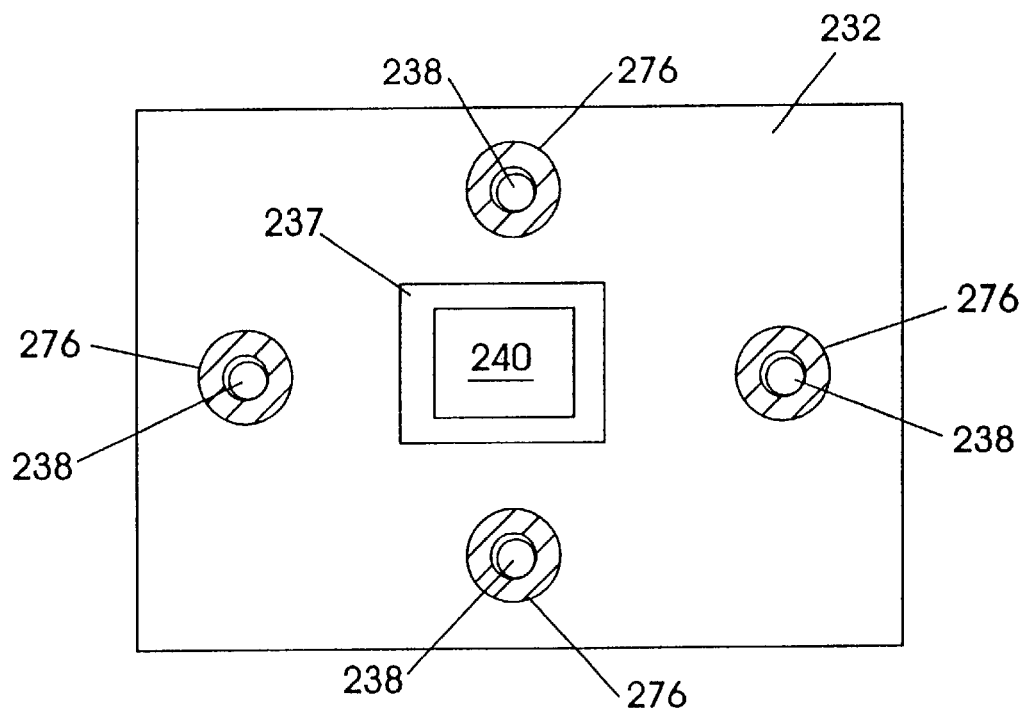
FIG. 6 shows a plan view of a stiffener in accordance with the third embodiment of the present invention.
Figure 7:
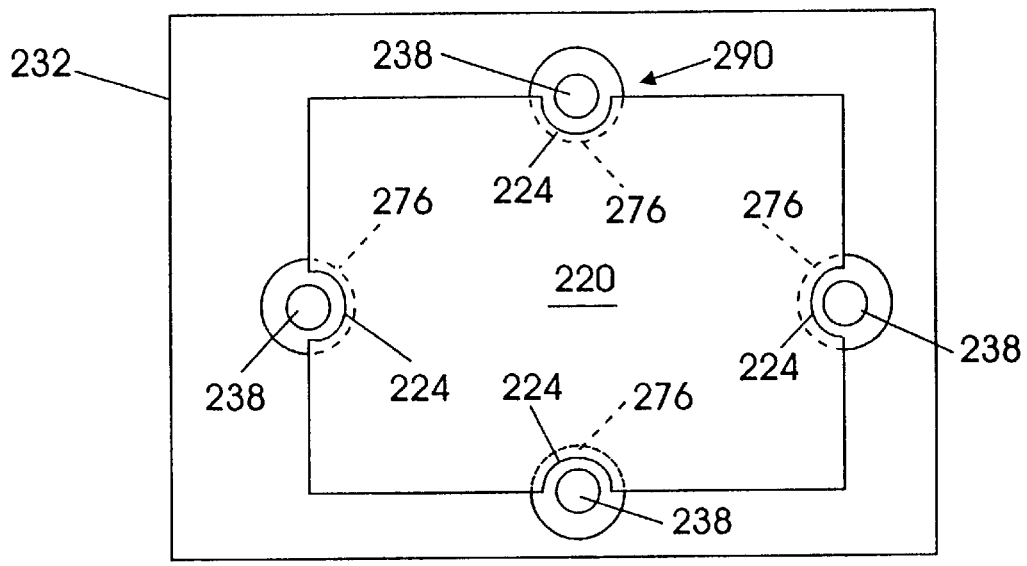
FIG. 7 shows a plan view of a chip package in accordance with the third embodiment of the present invention.

FIGS. 5–7 show a third embodiment of the present invention. In this embodiment the stiffener and cover plate combination are provided with an alignment device 290 that aids in properly aligning the cover plate 220 on the stiffener 232. The cover plate 220 may include the raised area 222 including bonding material 274 thereon to attach to the chip. The stiffener includes an opening 237 for housing the chip 240.

The alignment device 290 generally includes a plurality of posts 238 extending from the stiffener and a plurality of matching recesses or openings 224 in the cover plate 220. The cover plate 220 is attached to the stiffener 232 by a plurality of reflowable bonding material rings or doughnuts 276. The rings 276 may be provided either on the stiffener 232, or the cover plate 220 if enough surface tension exists to hold the rings 276 to the cover plate 220. In either position, the rings will eventually encircle or surround the posts 238 for proper attachment. An advantage of the rings 276 is that they may be preformed and then located around the posts 238 as necessary.

When the package is heated, the rings 276 melt and attach the cover plate 220 to the stiffener 232. Once again, the rings 276 and interface material 274 may be made from the materials as outlined above except that it may no longer be efficient to screen on low melt solder paste around the posts 238 for connection of the cover plate 220 and stiffener 232. Further, as noted above, the materials 270, 272, 274 may be electrically conductive.

The alignment device 290 allows for more precise positioning of the cover plate 220 relative to the stiffener 232 which aids in creating better tolerances, the reduction of uneven layering and crack prevention. It is important to note, however, that particular geometry of posts 238 and openings 224 may be altered as the alignment device may take a variety of forms. For instance, the posts 238 and openings 224 may be located at the corners of the cover plate 220. Further, there need not be four posts 238 and openings 224. As shown in FIG. 2B, an alignment device may not require any openings that extend through the cover plate 20. Further, the cover plate need not require any openings, as shown in FIG. 1, as the alignment device may be provided by the provision of risers 34, 36 which direct the cover plate 20 to the desired position.

In terms of the method in accordance with the present invention, the chip 40 to carrier 50 connection step is preferably performed prior to connection of the cover plate 20 to the stiffener 30 or the carrier 50 to other circuitry. Once completed, in accordance with the present invention, the stiffener 30 and cover plate 20 connecting step is preferably completed simultaneously with the connection of the carrier 50 to other circuitry, e.g., on a substrate 80 of electronic circuit board. Further, if the cover plate 20 is to be connected to the chip 40, then this step may also be provided simultaneously with the carrier 50 and other circuitry connecting step. The ability to make these connections simultaneously reduces the number of heating steps required to form a chip package and, hence, the potential for die (or chip) crack initiation.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims. For-example, the cover plate could also be attached after chip bonding and encapsulation and prior to attachment of the carrier to the electronic circuit board.

We claim:

1. A chip package comprising;
   a chip carrier;
   a stiffener attached to the carrier, having an opening therein and a plurality of posts extending from a surface of the stiffener, wherein the opening is adapted to have a chip placed within the opening, and wherein the stiffener is attached to the carrier by being attached to a majority portion of a surface of the carrier; and
   a cover plate attached to the surface of the stiffener, and self-centered within the opening of the stiffener by a reflowable bonding material.

2. The chip package of claim 1, wherein the cover plate includes a plurality of openings that match the plurality of posts extending from the stiffener.

3. The chip package of claim 1, wherein the bonding material surrounds the posts.

4. The chip package of claim 1, wherein the bonding material is an electrically conductive solder material.

5. The chip package of claim 4, wherein the cover plate is set at a predetermined electrical potential.

6. A chip package comprising:
   a chip carrier;
   a stiffener mounted on the carrier, having a plurality of posts extending from a surface of the stiffener, wherein the stiffener is attached to the carrier by being attached to a majority portion of a surface of the carrier; and
   a cover plate to cover the stiffener, wherein the cover plate is self-centered on the stiffener by a reflowable bonding material.

7. The chip package of claim 6, wherein the cover plate includes a plurality of openings that mate with the plurality of posts extending from the stiffener.

8. The chip package of claim 6, wherein the bonding material encircles each post.

9. The chip package of claim 6, wherein the stiffener includes an aperture therein and the cover plate includes a raised area thereon that fits into the aperture.

10. The chip package of claim 9, further comprising a chip positioned within the aperture and attached to the raised area by an interface material.

11. The chip package of claim 10, wherein the interface material is selected from the group consisting of an adhesive, low melt solder paste, and thermal grease.

12. The chip package of claim 11, wherein the low melt solder paste is tin lead based.

* * * * *